(12) United States Patent
Schmitt

(10) Patent No.: US 6,785,107 B1
(45) Date of Patent: Aug. 31, 2004

(54) POWER SEQUENCE PROTECTION FOR A LEVEL SHIFTER

(75) Inventor: Jonathan Schmitt, Eden Prairie, MN (US)

(73) Assignee: LSI Logic Corporation, Milpitas, CA (US)

( * ) Notice: Subject to any disclaimer, the term of this patent is extended or adjusted under 35 U.S.C. 154(b) by 181 days.

(21) Appl. No.: 09/888,207

(22) Filed: Jun. 22, 2001

(51) Int. Cl.[7] ............................................... H02H 3/20
(52) U.S. Cl. ........................................ 361/91.1; 361/90
(58) Field of Search ........................... 361/90, 91.1, 92; 327/108, 333

(56) References Cited

U.S. PATENT DOCUMENTS

| | | | | | |
|---|---|---|---|---|---|
| 4,656,373 A | * | 4/1987 | Plus | .............................. | 326/81 |
| 5,669,684 A | * | 9/1997 | Agan | ........................... | 326/81 |
| 5,963,061 A | * | 10/1999 | Briner | ........................... | 327/55 |
| 6,002,290 A | * | 12/1999 | Avery et al. | .................. | 327/333 |
| 6,043,698 A | * | 3/2000 | Hill | ............................... | 327/333 |
| 6,118,323 A | * | 9/2000 | Chaine et al. | ............... | 327/333 |
| 6,191,616 B1 | * | 2/2001 | Merritt et al. | ................. | 326/81 |
| 6,201,428 B1 | * | 3/2001 | Clark | .......................... | 327/333 |
| 6,222,384 B1 | * | 4/2001 | Kim | .............................. | 326/68 |
| 6,320,414 B1 | * | 11/2001 | Annema et al. | ............... | 326/80 |
| 6,351,173 B1 | * | 2/2002 | Ovens et al. | ................. | 327/333 |
| 6,384,631 B1 | * | 5/2002 | Wert et al. | ..................... | 326/68 |
| 6,507,226 B2 | * | 1/2003 | Swonger et al. | ............. | 327/108 |
| 6,545,521 B2 | * | 4/2003 | Dale et al. | ................... | 327/333 |
| 2002/0083352 A1 | * | 6/2002 | Fujimoto et al. | ............ | 713/300 |

* cited by examiner

Primary Examiner—Brian Sircus
Assistant Examiner—Danny Nguyen
(74) Attorney, Agent, or Firm—Fitch, Even, Tabin & Flannery

(57) ABSTRACT

A method of power sequence protection for a level shifter is disclosed that includes the steps of placing the level shifter in a pre-selected state if an input voltage supply is not powered on when an output voltage supply is powered on and releasing the level shifter from the pre-selected state to follow transitions of an input signal when the input voltage supply is powered on.

7 Claims, 2 Drawing Sheets

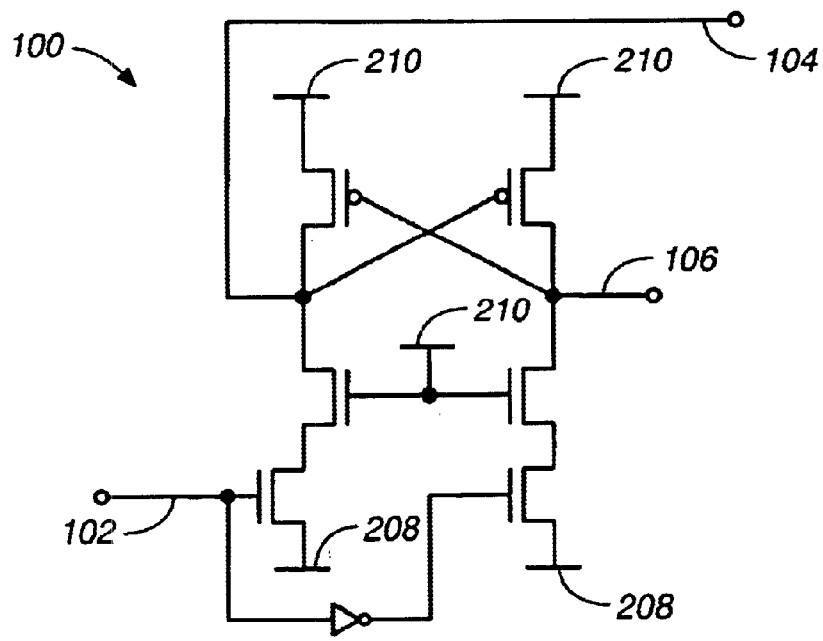
FIG._1
(PRIOR ART)
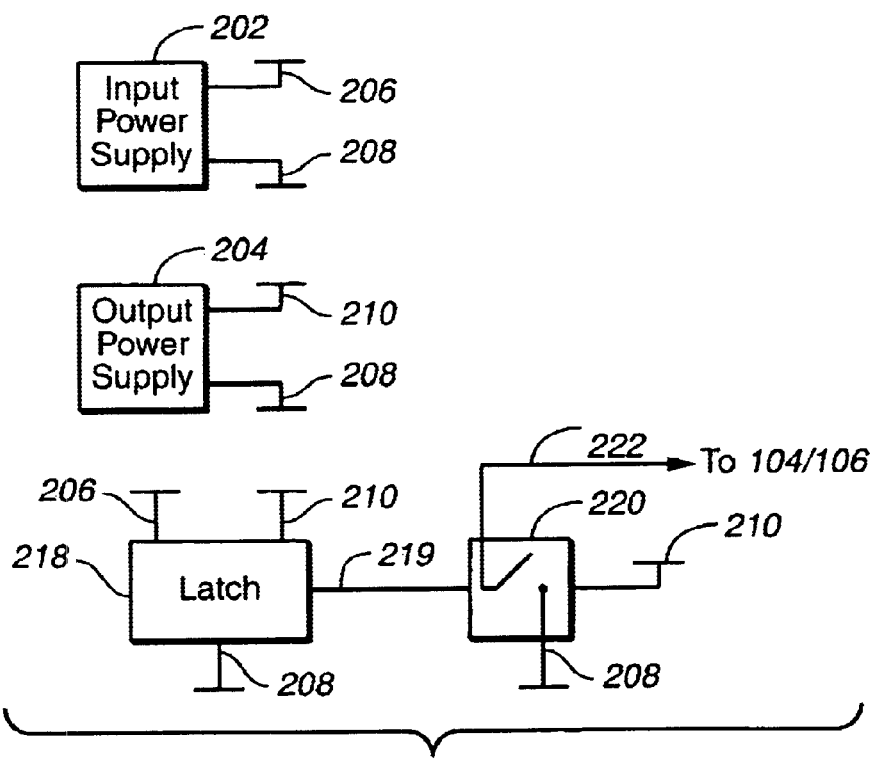
FIG._2

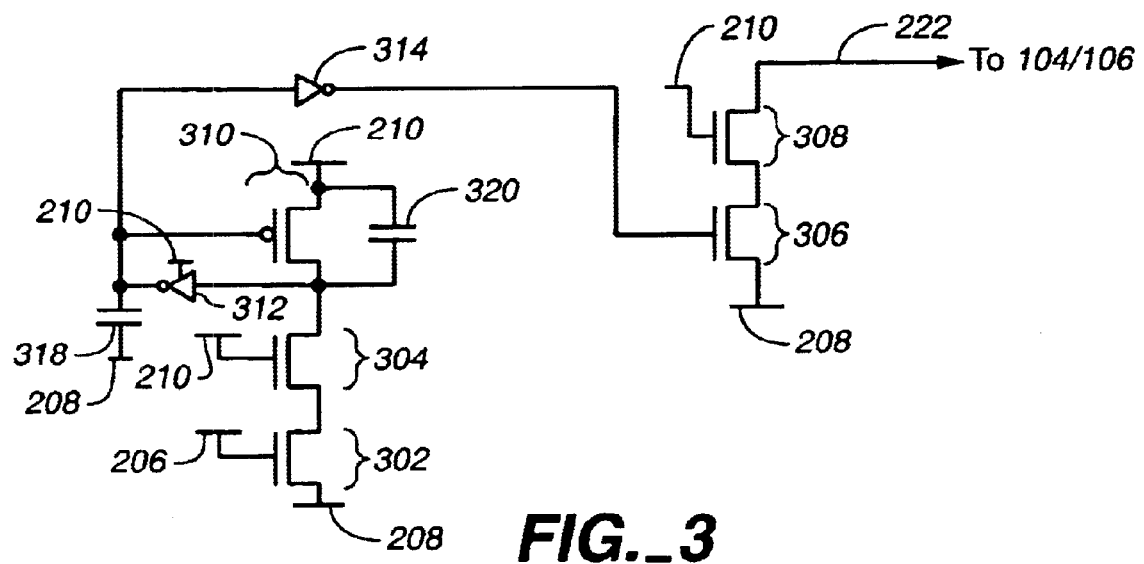
FIG._3
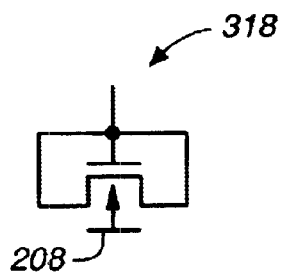
FIG._4
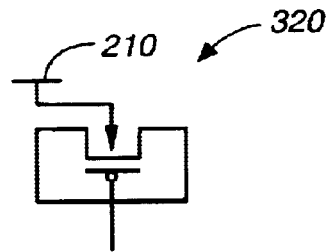
FIG._5

US 6,785,107 B1

POWER SEQUENCE PROTECTION FOR A LEVEL SHIFTER

BACKGROUND OF THE INVENTION

The present invention relates generally to electronic circuits having multiple power supplies. More specifically, but without limitation thereto, the present invention relates to a method of placing a level shifter in a known state if the output voltage supply is powered on when the input voltage supply is not powered on.

In electronic circuit design, a level shifter is often used to convert a digital signal from a voltage level that switches between an input voltage and ground to another voltage level that switches between an output voltage and ground. For example, the input voltage may be 5 volts, and the output voltage may be 15 volts.

A problem arises when the input voltage supply that powers the circuit generating the digital signal is not powered on when the output voltage supply that powers the circuit receiving the level shifted digital signal is powered on. In this situation, the state of the level shifter is indeterminate, and may result in potentially damaging currents if the end user of the digital signal does not provide protection for powering up the voltage supplies out of sequence.

SUMMARY OF THE INVENTION

The present invention advantageously addresses the problems above as well as other problems by providing a method of placing a level shifter in a pre-selected state if the output voltage supply is powered on when the input voltage supply is not powered on.

In one embodiment of the present invention, a method of power sequence protection for a level shifter includes the steps of placing the level shifter in a pre-selected state if an output voltage supply is powered on when an input voltage supply is not powered on; and releasing the level shifter from the pre-selected state when the input voltage supply is powered on.

In another embodiment of the present invention, a power sequence protection circuit includes a latch electrically coupled to an input voltage supply and an output voltage supply and a switch electrically coupled to the latch wherein the switch has a first state for holding the level shifter in a pre-selected state if the output voltage supply is powered on when the input voltage supply is not powered on and a second state for releasing the level shifter from the pre-selected state to follow transitions of an input signal when the input voltage supply is powered on.

BRIEF DESCRIPTION OF THE DRAWINGS

The present invention is illustrated by way of example and not limitation in the accompanying figures, in which like references indicate similar elements, and wherein:

FIG. 1 is a diagram illustrating a circuit for a typical level shifter of the prior art;

FIG. 2 is a block diagram of a power sequence protection circuit according to an embodiment of the present invention;

FIG. 3 is a circuit diagram for the power sequence protection circuit of FIG. 2; and FIGS. 4 and 5 are diagrams illustrating capacitors for the power sequence protection circuit of FIG. 2.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE EMBODIMENTS

An example of a use of a level shifter is the input/output (I/O) section of an integrated circuit. The I/O section is controlled by a digital signal generated by the integrated circuit that outputs a digital signal from the integrated circuit to another circuit powered by a separate power supply, often at a different voltage, such as a line receiver. If the power supply for the integrated circuit is not powered on when the separate power supply for the other circuit is powered on, the level shifter may assume an unwanted state that may result in bus contention or a virtual short of the separate power supply to ground.

FIG. 1 is a diagram illustrating a circuit for a typical level shifter. Shown in FIG. 1 are a level shifter 100, an input signal port 102, an output signal 104 port, and an inverted output signal port 106.

In normal operation, the output signal at the output signal port 106 of the level shifter 100 follows the transitions of input signal at the input signal port 102, but instead of switching between a common voltage level and a voltage level VDD from an input power supply used to generate the input signal at the input port 102, the output signal at the output signal port 106 switches between the common voltage level and a voltage level VCC from an output power supply. The inverse of the output signal is generated as output from the inverted output signal port 104. In accordance with an embodiment of the present invention, a power sequence protection circuit can ensure that the level shifter is held in a pre-selected state when the input power supply is not powered on and there is no input signal at the input signal port 102 of the level shifter 100.

FIG. 2 is a block diagram of a power sequence protection circuit according to an embodiment of the present invention. Shown in FIG. 2 are an input power supply 202, an output power supply 204, a VDD rail 206, a common voltage rail 208, a VCC rail 210, a latch 218, a latch output 219, a switch 220, and a switch output 222.

The latch 218 is connected to the VDD rail 206 of the input power supply 202 and to the VCC rail 210 of the output power supply 204. The common voltage rail 208 is the return for all voltages generated in the circuit. The switch 220 is connected to the latch output 219. If the output power supply 204 is powered on before the input power supply 202 is powered on; then the latch output 219 sets the switch output 222 to a first state in which the common voltage rail 208 is connected to either the output signal port 104 or the inverse output signal port 104 of the level shifter 100, forcing the other output signal port to the VCC voltage rail 210.

When both the input power supply 202 and the output power supply 204 are powered on, then the latch output 219 sets the switch output 222 to a second state that presents a high impedance to the connected output signal port of the level shifter 100, releasing the level shifter 100 to follow the transitions of the input signal 102.

FIG. 3 is a circuit diagram of the power sequence protection circuit of FIG. 2. Shown in FIG. 3 are N-channel field effect transistors 302, 304, 306, and 308, a P-channel field effect transistor 310, inverters 312 and 314, capacitors 318 and 320, a VDD voltage rail 206, a VCC voltage rail 210, a common voltage rail 208, and a switch output 222.

The VDD voltage rail 206 is connected to the input power supply 202 in FIG. 2. The VCC voltage rail 210 is connected to the output power supply 204. The N-channel field effect transistors 302 and 304 are connected in series between the source of the P-channel field effect transistor 310 and the common voltage rail 208 so that if either the input power supply 202 or the output power supply 204 is not powered on, then the source of the P-channel field effect transistor 310 is presented with a high impedance. If both the input power supply 202 and the output power supply 204 are powered on, then the source of the P-channel field effect transistor 310 is held close to the common voltage rail 208.

The inverter 312 is connected between the source of the P-channel field effect transistor 310 and the junction of the gate of the P-channel field effect transistor 310 and the input of the inverter 314 so that the P-channel field effect transistor 310 is latched on unless both the input power supply 202 and the output power supply 204 are powered on. If both the input power supply 202 and the output power supply 204 are powered on, then the output of the inverter 312 drives the P-channel field effect transistor 310 to the off state.

The capacitor 318 is connected to the junction of the gate of the P-channel field effect transistor 310 and the input of the inverter 314 so that the input of the inverter 314 is momentarily pulled low when the input power supply 202 is powered on.

The output of the inverter 314 is connected to the source of the N-channel field effect transistor 306. If both the input power supply 202 and the output power supply 204 are powered on, then the output of the inverter 314 is driven to the common voltage rail. The capacitor 320 is connected to the junction of the source of the P-channel field effect transistor 310 and the input of the inverter 312 to latch the P-channel field effect transistor 310 in the conducting state if the input power supply 202 is not powered on.

The N-channel field effect transistors 306 and 308 are connected in series between either the output signal port 104 or the inverse output signal port 106 of the level shifter output and the common voltage rail 208. The gate of the N-channel field effect transistor 306 is connected to VCC, and the gate of the N-channel field effect transistor 308 is connected to the output of the OR gate 316 so that the connected output port of the level shifter 100 is driven to the common voltage rail if the output power supply 204 is powered on when the input power supply 202 is not powered on. When both the input power supply 202 and the output power supply 204 are powered on, then the connected output port of the level shifter 100 is released and allowed to follow the transitions of the input signal at the input port 102.

FIGS. 4 and 5 are diagrams illustrating capacitors for the power sequence protection circuit of FIG. 2 using the capacitance between the source/drain and the bulk/well of a field effect transistor. In FIG. 4, the capacitor 318 is made by connecting the source, drain, and gate of an N-channel field effect transistor to the output of the inverter 312 and the bulk/well to the common voltage rail 208. In FIG. 5, the capacitor 320 is made by connecting the source, drain, and gate of a P-channel field effect transistor to the source of the P-channel field effect transistor 310 and the bulk/well to the VCC voltage rail 210.

As described above, the power sequence protection circuit shown in FIG. 3 advantageously places the level shifter 100 in a pre-selected state if the output voltage supply is powered on before the input voltage supply is powered on and releases the level shifter 100 from the pre-selected state to follow transitions of an input signal when the input voltage supply is powered on.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A power sequence protection circuit comprising:
  a latch electrically coupled to an input voltage supply and an output voltage supply; and
  a switch electrically coupled to the latch wherein the latch sets the switch to a first state for holding a level shifter in a pre-selected state if the output voltage supply is powered on when the input voltage supply is not powered on and wherein the latch sets the switch to a second state for releasing the level shifter from the pre-selected state when the input voltage supply and the output voltage supply are powered on.

2. The power sequence protection circuit of claim 1 wherein the switch connects a common voltage rail to an output signal port or an inverted output signal port of the level shifter in the first state.

3. The power sequence protection circuit of claim 2 wherein the switch presents a high impedance to the output signal port or the inverted output signal port of the level shifter in the second state.

4. The power sequence protection circuit of claim 1 further comprising the level shifter.

5. A power sequence protection circuit comprising:
  a switch connected to a level shifter between an output signal port or an inverted output signal port of the level shifter and a common voltage rail; and
  a latch connected to the switch to drive the switch to a conducting state if an input voltage supply is not powered on when an output voltage supply is powered on and to drive the switch to a non-conducting state if the input voltage supply and the output voltage supply are powered on.

6. The power sequence protection circuit of claim 5 wherein the switch comprises two field effect transistors connected in series.

7. The power sequence protection circuit of claim 5 wherein the latch comprises two field effect transistors connected in series between a third field effect transistor and the common voltage rail.

* * * * *